United States Patent [19]

Davarian

[11] Patent Number: 4,835,792
[45] Date of Patent: May 30, 1989

[54] UNIVERSAL FM RECEIVER FOR MOBILE COMMUNICATIONS

[75] Inventor: Faramaz Davarian, Los Angeles, Calif.

[73] Assignee: California Institute of Technology, Pasadena, Calif.

[21] Appl. No.: 147,540

[22] Filed: Jan. 25, 1988

[51] Int. Cl.$^4$ .............................................. H04B 1/16
[52] U.S. Cl. ...................................... 375/80; 375/90; 375/97; 329/2; 455/142
[58] Field of Search ............... 375/75, 78, 88, 90, 375/97; 455/142, 205, 208; 329/1, 2, 112, 145

[56] References Cited

U.S. PATENT DOCUMENTS 2,416,911  3/1947  Crosby ..................................... 329/2
3,348,168  10/1967  Melchior et al. ..................... 455/142
4,467,360  8/1984  Fosse ...................................... 455/142

OTHER PUBLICATIONS

Francis D. Natali, AFC Tracking Algorithms, IEEE Transactions on Communications, vol. Com-32, No. 8, Aug. 1984, pp. 935-947.
Faramaz Davarian and Joe Sumida, Hardware Simulator Assists Mobile Satellite Experiment, 35th IEEE Vehicular Technology Conference, pp. 238-245, May 1985.
K. J. P. Fonseka and N. Ekanayake, Differential Detection of Narrow-Band Binary FM, IEEE Transactions on Communications, vol. Com-33, No. 7, Jul. 1985, pp. 725-729.
F. Davarian, M. Simon and J. Sumida, DMSK: A Practical 2400-bps Receiver for the Mobile Satellite Service, JPL Publication 85-51 (MSAT-X Report No. 111)., pp. 1-35, Jun. 15, 1985.

Primary Examiner—Benedict V. Safourek
Attorney, Agent, or Firm—Freilich, Hornbaker, Rosen & Fernandez

[57] ABSTRACT

A dual purpose receiver operable both on FM analog (voice) and MSK digital (data) signals has a demodulation section having a selectable time delay $D_1$ for processing MSK digital signals and a time delay $D_2$ for processing FM analog signals. A switch permits selection of the time delay for the demodulating mode desired. A second switch set according to how the first switch is set connects a digital processing circuit or an analog processing circuit to the output of the demodulation section. Small frequency errors due to frequency drift of the local oscillator or signal source and doppler effects can be eliminated by an automatic frequency control (AFC) circuit responsive to the output of the demodulator in the analog mode, and through a third switch responsive to a signal developed by mixing the input signal with the input signal delayed by a time delay $D_1$, and mixing the output of that mixer with the binary output of the receiver in the MSK mode.

5 Claims, 2 Drawing Sheets

UNIVERSAL FM RECEIVER FOR MOBILE COMMUNICATIONS

ORIGIN OF INVENTION

The invention described herein was made in the performance of work under a NASA contract, and is subject to the provisions of Public Law 96-517 (35 USC 202) in which the Contractor has elected to retain title.

BACKGROUND OF THE INVENTION

This invention relates generally to transceivers used in mobile communications, and more specifically to universal receivers capable of receiving both analog and digital FM signals.

The new trend in mobile communications is towards integrated voice and data services. Voice is the most commonly used mode of communications for network subscribers; whereas, data transmission is required for sending control commands between a mobile terminal and the network management center. Recently, alphanumeric message transmission has also gain popularity with the network subscribers as a more cost effective means of communications. For system simplicity as well as economy, it is desired to employ a single transceiver to accommodate both analog (voice) and digital (data) signals. Conventionally, voice services have utilized analog frequency modulation (FM), while data services have had a tendency to employ frequently shift keying (FSK) or differential phase shift keying (DPSK) techniques.

In the integration of two modulation modes of analog (voice) and digital (data) transmission, no performance degradation should be allowed. In other words, the fact that a particular design is dual purpose should have no impact on the performance of either of the two modes of operation. Desirably, such a unit will yield good power performance for both analog and digital signals.

A paper by F. Davarian, M. Simon and J. Sumida, "DMSK: A Practical 2400-bps Receiver for the Mobile Satellite Service, JPL publication No. 85-51, June 1985, describes a robust receiver for digital signals in a mobile environment. This receiver uses differential minimum shaft keying (DMSK) which is a form of frequency shift keying. A conventional DMSK receiver demodulates a frequency modulated signal by a KT delay and multiply operation, where K is an integer and T is the bit time. The generalized block diagram of the receiver when delay D equals T is shown in FIG. 1.

A paper by K. Fonseka and N. Ekanayake, "Differential Detection of Narrow-Band Binary FM," IEEE Trans. Commun., July 1985, considers differential detection of narrowband binary FM, using a detector which employs a delay line whose delay period is dependent on the value of the modulation index of an associated transmitter. The error-rate performance was computed for the receiver and compared with that of a comparable limiter-discriminator (L-D) receiver. It was shown by the comparison that differential detection yields performance comparable to L-D detection.

SUMMARY OF THE INVENTION

The prime object of the invention is to provide a dual purpose receiver operable both on analog and digital FM signals. Such a receiver is normally integrated with a transmitter and marketed as a transceiver.

This and other objects are achieved according to the present invention by providing a circuit having a demodulator with a first time delay for processing digital signals and a second time delay for processing analog signals. A switch permits selection of the time delay desired, while further switches permit correlated variation in a delay time applied in an automatic frequency control (AFC) circuit advantageously provided for eliminating small frequency errors due to oscillator drift and doppler effects.

DESCRIPTION OF THE PREFERRED EMBODIMENTS

Figure 1:
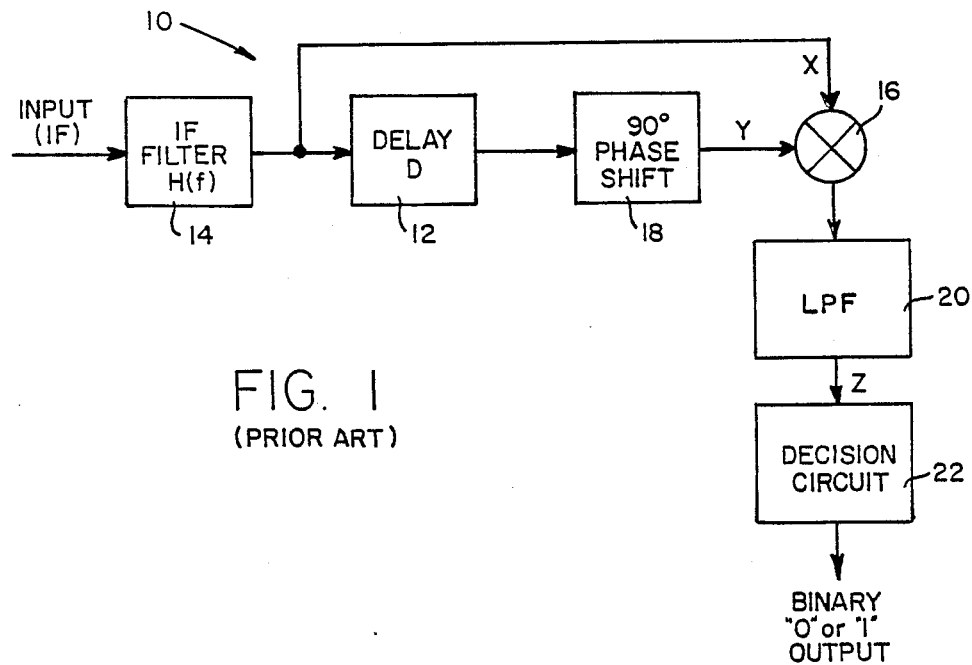
FIG. 1 is a functional block diagram of a one-bit differential detector for a minimum shift keying (MSK) receiver.

As mentioned above, differential minimum shift keying (DMSK) is known for digital signal transmission. It uses a receiver 10 of the type illustrated in FIG. 1. Note that this receiver is still valid for binary FM reception with a modulation index other than that of minimum shift keying (MSK) if the delay circuit 12 is adjusted to accommodate the transmitter modulation index. See Foneska, et al., supra. Therefore with a time delay D as a parameter, the receiver of FIG. 1 is for binary FM with arbitrary modulation index. It has been shown that the power performance of this receiver is similar to limiter-discriminator (L-D) receivers. K. Fonseka and N. Ekanayake, "Differential Detection of Narrow-Band Binary FM," IEEE Trans. Comm., July 1985 and M. Simon and C. Wang, "Two-Bit Differential Detection of MSK," Proc. GLOBCOM, Nov. 1984. The advantage of this receiver of FIG. 1 compared to L-D receivers is its simplicity. In practice this receiver of FIG. 1 is implemented in baseband (see Davarian, et al., supra), hence eliminating the need for bandpass filtering. On the other hand, L-D detection has the disadvantage of needing a bandpass filter and dependency on the zero crossing of its discriminator. Drifting of this zero crossing can severely impair performance.

The prior-art receiver 10 includes, in series with the delay 12, an intermediate-frequency (IF) filter 14 and a mixer 16 which mixes a delayed signal Y with an undelayed signal X. A 90° phase shift circuit 18 is inserted between the filter 14 and the mixer 16, either before or after the delay circuit 12, for performing a phase shift on the delayed signal Y prior to being mixed with signal X in the mixer 16.

The output from the mixer 16 is passed through a lowpass filter (LPF) 20, which, for example, can be either a Gaussian or a second-order Butterworth filter, as described by Fonseka, et al., supra, and a filtered signal Z is fed into a decision circuit which outputs a zero (0) or one (1), depending on the input signals polarity. The circuit 22 thus outputs a binary coded signal. It will be demonstrated that the circuit of FIG. 1 can also be used as a receiver for analog FM voice signals. To do so, let s(t) denote the speech signal and K denote the FM modulation constant. Let $\omega_o$ denote the carrier angular frequency. Then the received FM signal x(t) can be represented as:

$$x(t) = A \cos\left[\omega_0 t + K \int_{-\infty}^{t} s(\beta) d\beta\right]$$

After experiencing a time delay D, and a phase delay of 90° the signal at point Y may be written as:

$$y(t) =$$

$$-A \sin\left[\omega_0 t - \omega_0 D + \int_{-\infty}^{t} s(\beta) d\beta - K \int_{t-D}^{t} s(\beta) d\beta\right]$$

And, finally, at point Z, the signal is expressed as $$z(t) = (1/2) A^2 \sin\left[K \int_{t-D}^{t} s(\beta) d\beta\right] \quad (1)$$

where, in Equation (1), it is assumed that $\omega_0 D$ is an integer multiple of $2\pi$.

At this point let B denote the bandwidth of the speed signal, and further assume that $$D << 1/B \quad (2)$$

The above inequality imples that s(t) is slowly changing over a time duration of size D. Hence Equation (1) may be simplified to $$z(t) = (\tfrac{1}{2}) A^2 \sin [KDs(t)] \quad (3)$$

Now with a second restriction of $$KD|s(t)|_{max} < \pi/10 \quad (4)$$

Equation (3) may be linearized, resulting in the following equation:

$$z(t) = (\tfrac{1}{2}) A^2 KDs(t) \quad (5)$$

Now let $\Delta F$ denote the maximum frequency deviation:

$$\Delta F = \frac{1}{2\pi} K|s(t)|_{max}$$

and let E denote the frequency deviation ratio defined as:

$$E = \frac{\Delta F}{B}$$

with $b << 1$, the inequality of Equation (2) can be expressed by the following quality $$D = b/B \quad (6)$$

Hence, Equation (4) can be written as $$2\pi \frac{b}{B} \Delta F < \pi/10$$

or $$bE < 1/20$$

For example, if $E = 0.5$, then $b < 0.1$. Now using Equation (6), we may write $$D \leq \frac{1}{20BE} = \frac{1}{20 \Delta F}$$

Since speech bandwidth is about 3 KHz, the time delay D should be about 0.03 ms or less.

The noise performance of the receiver 10 is similar to L-D receivers when the transmitted signal is voice. In the following, we demonstrate this point by assuming a high signal-to-noise ratio (SNR). In the presence of noise, the received waveform may be represented as:

$$x(t) = R(t) \cos\left[\omega_0 t + K \int_{-\infty}^{t} (\beta) d\beta + \eta(t)\right]$$

where R(t) is the noisy envelope of the signal and $\eta(t)$ is the phase noise due to the thermal noise. For high SNR, this term is given by:

$$\eta(t) = -\frac{n_s}{\sqrt{2P}}$$

where $n_s$ is a white Gaussian noise process with power density $N_o$ (double sided), and P is the carrier power. The demodulated signal at point Z may be written as:

$$z(t) = \tfrac{1}{2} R(t) R(t-D) \sin [DKs(t) + \eta(t) - \eta(t-D)] \quad (7)$$

The noise difference term in Equation (7) may be approximated for small time delay D by $$\eta(t) - \eta(t-D) = \dot{\eta}(t) D$$

where $\dot{\eta}(t)$ denotes the derivative of $\eta(t)$ with respect to time. Hence, Equation (7) may be rewritten as:

$$z(t) = \tfrac{1}{2} R(t) R(t-D) \sin [KDs(t) + \dot{\eta}(t) D] \quad (8)$$

After linearization Equation (8) becomes:

$$z(t) = \tfrac{1}{2} R(t) R(t-D) D [Ks(t) + \dot{\eta}(t)] \quad (9)$$

The above signal will be filtered by a lowpass filter of bandwidth B and then passed to a speaker to be heard. The product $R(t) R(t-D)$ acts like small fluctuations of the sound volume that can be removed by placing a hard limiter in the IF stage. The output SNR of the receiver can now be calculated by observing Equation (9). The power spectral density of noise $\dot{\eta}(t)$ is given by:

$$\psi_{\dot{\eta}}(\omega) = \omega^2 N_o/(2P).$$

Therefore, the noise power, N, is given by:

$$N = (2\pi)^2 \frac{N_o B^3}{3P}.$$

The detected signal power, S, is given by:

$$S = K^2 \overline{s^2}(t)$$

Hence, the signal-to-noise (SNR) ratio is:

$$r = \frac{S}{N} = \frac{3PK^2\overline{s^2}(t)}{N_o B^3 (2\pi)^2} \quad (10)$$

The above ratio is identical to the one derived for L-D detection of speech. It can also be represented as:

$$r = \frac{3P}{N_o B} \frac{\overline{s^2}(t)}{|s(t)|^2_{max}} E^2$$

Figure 2:
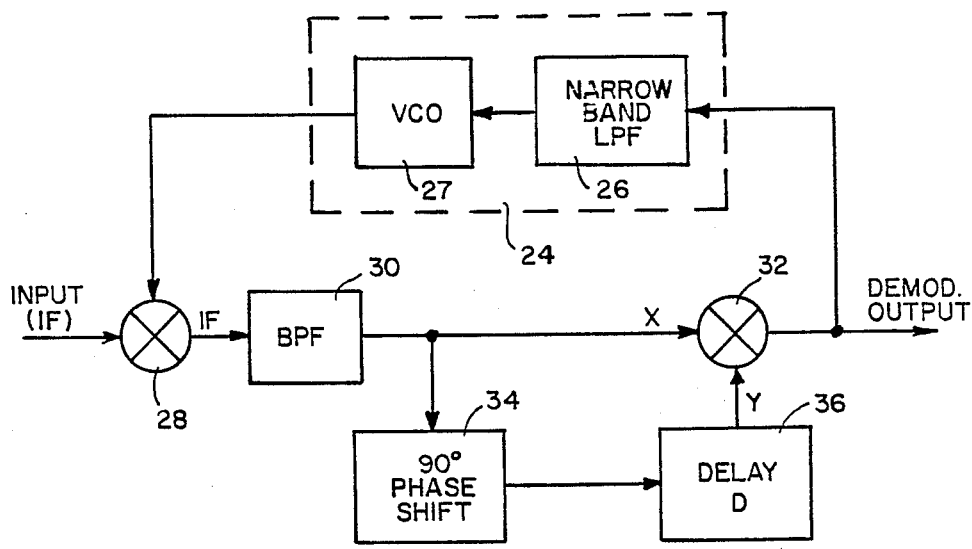
FIG. 2 is a functional block diagram of an automatic frequency control (AFC) circuit.

An automatic frequency control (AFC) circuit can be added to the receiver 10 to guard against small frequency errors due to oscillator drift or doppler effect. FIG. 2 shows the block diagram of a suitable AFC circuit 24 having a narrowband lowpass filter 26. A received radio frequency (RF) signal is mixed with a signal from a conventional voltage controlled oscillator (VCO) 27 in a mixer 28, and a resulting IF signal is fed to a suitable bandpass filter 30. The output from filter 30 goes to a mixer 32 directly and through a 90° phase shift circuit 34 and a delay circuit 36, in either order. The equations governing the behavior of this prior-art AFC circuit are presented below.

In the presence of a frequency error, $\omega_o D$ will not be an exact integer of $2\pi$, hence Equation (1) must be modified to:

$$z(t) = 0.5 A^2 \sin [KDs(t) + 2\pi D\delta F] \quad (11)$$

where $\delta F$ denotes the frequency error. After linearization, the following equation results:

$$z(t) = 0.5 A^2 D[Ks(t) + 2\pi\delta F] \quad (12)$$

The narrowband lowpass filter 26 which follows the mixer 32 rejects signal s(t) and only passes the low frequency term due to $\delta F$. Note that since audio signals do not have low frequency content, the signal contribution, or interference, to the AFC loop is minimal.

It can be shown that the AFC circuit of FIG. 2, identical to the one used for MSK digital signals as described in F. Davarian, M. Simon and J. Sumida, "DMSK: A Practical 2400-bps Receiver for the Mobile Satellite Service," JPL publication No. 8-51, June 1985, can also be used for FM analog (voice) signals. Thus, a single architecture can be used to demodulated both MSK digital signals and FM analog (voice) signals. A first switch can change the mode of the transceiver to the desired one, keeping in mind that the analog mode usually requires smaller delay than the digital mode, and a second switch can connected the demodulated MSK or FM signal to a digital decision circuit for the MSK digital mode and to a speaker for the FM analog mode. The AFC circuit 24 is connected to the demodulated FM signal by the second switch when the FM analog mode is selected. Because the AFC circuit 24 requires a different input signal for the MSK digital mode, a third switch is provided to connect the required input signal developed with a separate delay element 27 while the MSK digital mode is selected by the second switch, as will be described below with reference to FIG. 3.

Figure 3:
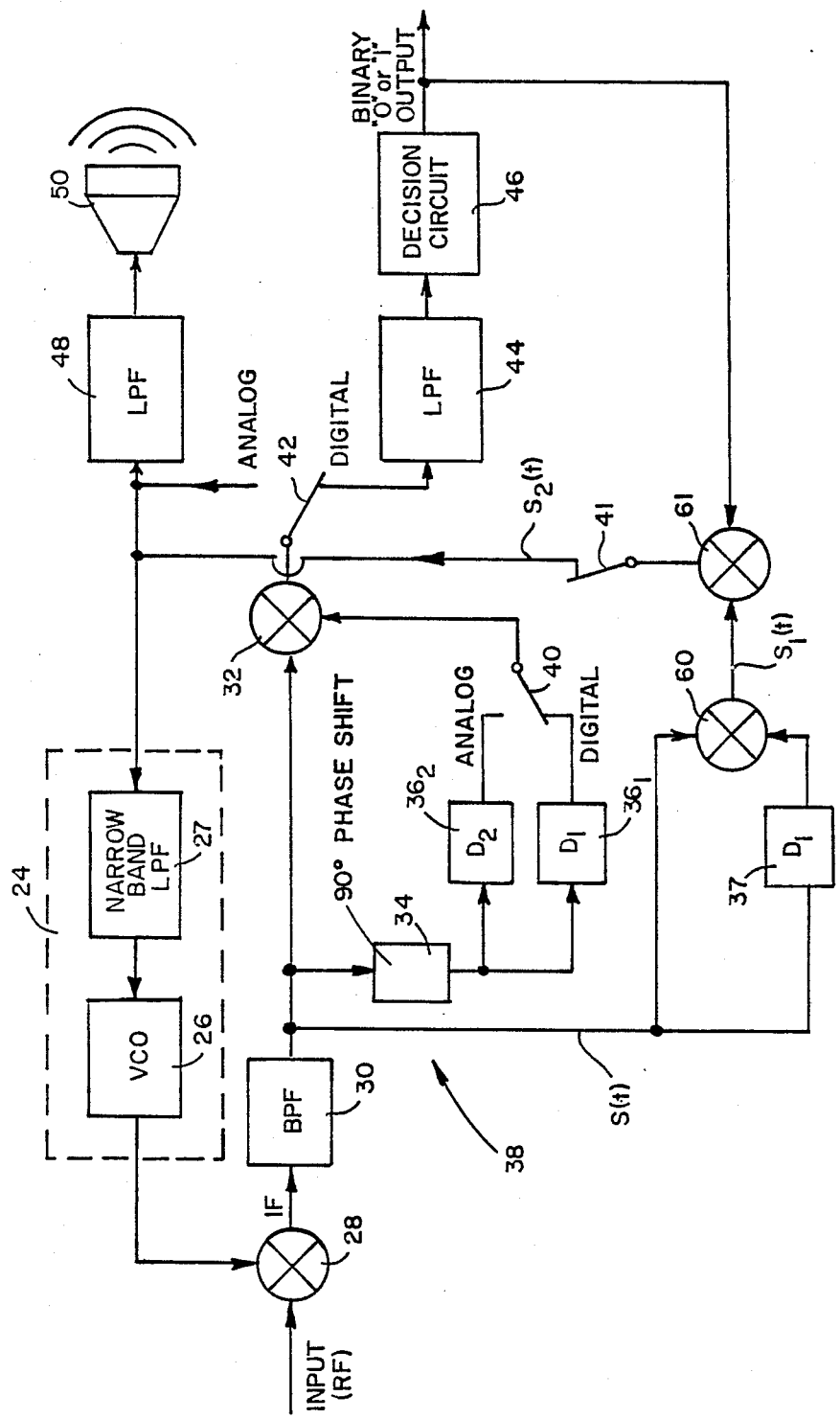
FIG. 3 is an integrated receiver for voice and data according to the present invention.

Referring to FIG. 3, a universal receiver 38 provides for both modes of operating according to to the present invention. As just noted, the same AFC structure described with reference to FIG. 2 works for the FM analog mode of operation to automatically correct small frequency errors.

In the implementation of the universal receiver 38, two alternative delay elements $36_1$, and $36_2$ are provided for the two modes of operation, together with a switch 40 for selecting the mode. A switch 41 is open for the FM analog, and closed for the digital mode to introduce a separately developed signal to the AFC circuit 24. Thus, for the MSK digital mode, the switch 40 is placed in the position shown to select a delay time $D_1$, and for the FM analog mode, the switch 40 is placed in its alternate position. A second switch 42 at the output of the mixer 32 permits selection of the utilization circuitry for the mode selected by the switch 40. Thus, for the digital mode selected by the switch 40 in the position shown, the switch 42 is placed in the position shown to connect the output of the mixer 32 to a lowpass filter 44 in cascade with a decision circuit 46, which are similar in design to the lowpass filter 20 and the decision circuit 22 in FIG. 1. The output of the decision circuit is a "0" or "1" for each of the sequential bits in the digital signal received. In the alternate position for the switch 42, selected when the switch 40 is in its alternate position, the output of the mixer 32 is connected to a lowpass filter 48 in cascade with a speaker 50 for the analog mode of operation. The switches 40 and 42 may be mechanically ganged together to facilitate the selections for the desired mode of operation.

It should be noted that the receiver 38 can be realized in baseband, thus avoiding the need for a bandpass filter 30. The baseband realization is simple, and is suitable for very large scale integration (VLSI) implementation.

To demonstrate the bandwidth occupancy of this receiver, an example will now be presented. Assume the voice bandwidth is 3.5 KHz and digital transmission rate is 9.6 kbps. With a modulation index of 0.5, the receiver optimum bandwidth requirement is about equal to the bit rate. Due to hardware limitations, it is usually advantageous to select the receiver bandwidth slightly higher than its optimum value as predicted by theory. Hence a receiver bandwidth of 10 KHz to 11 KHz is recommended. The delay time $D_2$ for voice can be about 0.03 ms or less and the delay time $D_1$ for data is about 0.1 ms. The receiver 38 can operate with a frequency uncertainty of close to 1200 Hz. The pull-in range of the AFC is 1200 Hz in this example. Voice reception quality is comparable to that of a limiter-discriminator (L-D) receiver.

The development of the input signal to the AFC circuit 24 with the delay element 37 will now be described. The signal applied directly to that separate delay element from the output of the filter 30 is denoted as:

$$s(t) = \cos [\omega_o t + \phi(t) + f_d t] \quad (13)$$

where $\phi(t)$ represents the digital data dependent phase of the carrier, $\omega_o$ is the intermediate angular frequency, and $f_d$ is Doppler frequency. Let $S_1(t)$ denote the signal at the output of a mixer 60 given by the following equation:

$$S_1(t) = \cos [\omega_o t + \phi(t) + f_d t] \cos [\omega_o t - \omega_o D_1 + \phi(t - D) + f_d t - f_d D_1] \quad (14)$$

Ignoring double frequency termins, equation (14) may be rewritten as:

$$S_1(t) = \tfrac{1}{2}\cos [\phi(t) - \phi(t - D_1) + f_d D_1] \quad (15)$$

It should be noted that $\omega_o D_1$ is assumed to be a multiple of $2\pi$ and $\phi(t)-\phi(t-D_1)=a_i\pi/2$ for MSK digital signals, where $a_i$ is the received bit signal and i is a bit index. In binary communication, $a_i = +1$ or $-1$. Therefore, equation (15) becomes:

$$S_1(t) = \tfrac{1}{2}\cos\left[a_i\frac{\pi}{2} + f_d D_1\right] \tag{16}$$

$$= \frac{a_i}{2}\sin(f_d D_1).$$

Let $S_2(t)$ denote the output of a mixer 61

$$S_2(t) = a_i S_1(t)$$

or $$S_2(t) = \tfrac{1}{2} a_i^2 \sin(f_d D_1) \tag{17}$$

$$= \tfrac{1}{2}\sin(f_d D_1)$$

For $f_d D_1 <<\pi$, equation (17) can be linearized to produce:

$$S_2(t) \approx \tfrac{1}{2} D_1 f_d$$

Consequently, the input signal to the AFC circuit 24 is proportional to the frequency error, i.e., the Doppler frequency $f_d$.

A baseband realization of the above AFC system for MSK digital signals was constructed and tested. See Faramaz Davarian, Marin Simon and Joe Sumida, "DMSK: A Practical 2400-bps Receiver for the Mobile Satellite Service," JPL Publication 85-51 (MSAT-X Report No. 111) June 15, 1985.

The switches 40, 41 and 42 can be set initially for analog reception and later, when digital communication comes into vogue, switched to digital reception. In that manner, the receiver of FIG. 3 may be used extensively until digital communication becomes widely available, and then selectively set for analog or digital communication service while both are still available. It is anticipated that at some point in time all communication will be digital.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. Apparatus for demodulating frequency modulated signals, said apparatus having two selective modes of operation for demodulating FM analog signals or MSK modulated digital signals, comprising
    means for mixing an FM analog signal or an MSK modulated digital signal with a delayed quadrature signal corresponding to said FM analog signal or MSK modulated digital signal for demodulation, thereby to produce a demodulated output,
    means for phase shifting said signals to be demodulated by 90°, thereby producing said quadrature signal,
    means for coupling said quadrature signal to said mixing means with a delay selectable for demodulation in said mixer of FM analog or MSK modulated digital signals, said coupling and delay means comprising,
        first time delay means for a mode of operation in demodulating MSK modulated digital signals,
        second time delay means for a mode of operation in demodulating FM analog signals,
        a first switch for selecting between said first time delay means and said second time delay means for the mode of operation desired,
    digital processing means for processing said demodulated output of said mixing means for said digital mode of operation,
    analog processing means for processing the output of said mixing means for said analog mode of operation, and
    a second switch for selecting between said digital and said analog processing means according to the selection of said first or second time delay means made by said first switch.

2. Apparatus as defined in claim 1 wherein said digital processing means for said digital mode includes
    a lowpass filter for passing only selected frequencies of signals received by said demodulator with said first time delay selected by said first switch, and
    decision means for receiving signals passed by said lowpass filter and emitting binary signals as a function of signals received.

3. Apparatus as defined in claim 1 wherein said processing means for said analog mode includes
    a lowpass filter for passing only selected frequencies of signals received by said demodulator with said second time delay means selected by said first switch, and
    analog means responsive to signals passed by said lowpass filter and, in response thereto, producing analog responses as a function of signals passed by said lowpass filter.

4. Apparatus as defined in claim 3, wherein said frequency modulated analog signal is modulated onto an RF carrier, further comprising a local oscillator and mixer responsive to the output of said local oscillator for converting said modulated RF carrier received into a modulated intermediate frequency, and means for automatic frequency correction of said intermediate frequency responsive to the output of said demodulation means for adjusting the output frequency of small frequency errors in said analog mode due to the frequency drift of said local oscillator or drift of the source of said RF signal received, such as from Doppler effects, said automatic frequency correction means including a narrowband lowpass filter for producing a voltage for control of said oscillator.

5. Apparatus as defined in claim 2, wherein said MSK modulated digital signal is modulated onto an RF carrier, further comprising a local oscillator and mixer responsive to the output of said local oscillator for converting said modulated RF carrier received into a modulated intermediate frequency, and means for automatic frequency correction of said intermediate frequency responsive to a control signal for adjusting the output frequency of said local oscillator to eliminate small frequency errors while in said MSK digital mode due to frequency drift of said local oscillator or drift of the source of said RF signal received, such as from Doppler effects, said automatic frequency correction means including a narrowband lowpass filter for producing a voltage for control of said oscillator in response to said control signal, and a third switch for connecting said control signal to said narrowband lowpass filter while in said MSK digital mode, and means for producing said control signal comprising first means for mixing said MSK modulated signals received with the same MSK modulated signals delayed by the same time as said first time delay means selected by said first switch for said MSK mode of demodulation, second means for mixing the output of said first mixing means with the output signal of said means for processing the output of said demodulator, and switching means for connecting said second mixing means to said narrow band lowpass filter while in said MSK mode of operation.

* * * * *